United States Patent [19]

Keefe et al.

[11] 4,403,305
[45] Sep. 6, 1983

[54] NON-DATA REVERSING BUBBLE TRANSFER SWITCH FOR CONTIGUOUS DISKS

[75] Inventors: George E. Keefe, Montrose, N.Y.; Ian L. Sanders, Sunnyvale, Calif.

[73] Assignee: International Business Machines Corporation, Armonk, N.Y.

[21] Appl. No.: 218,989

[22] Filed: Dec. 22, 1980

[51] Int. Cl.³ .............................................. G11C 19/08
[52] U.S. Cl. ......................................... 365/16; 365/36
[58] Field of Search ........................ 365/15, 16, 36, 39, 365/41, 43

[56] References Cited

U.S. PATENT DOCUMENTS 3,967,002  6/1976  Almasi et al. ......................... 365/41
4,264,985  4/1981  George et al. ......................... 365/41
4,283,776  8/1981  Nelson ................................... 365/36

OTHER PUBLICATIONS

IBM Technical Disclosure Bulletin, vol. 23, No. 6, Nov. 1980, "Data Rearrangement Switch", by G. E. Keefe and E. W. Pugh, (pp. 2595-2597).
The Bell System Technical Journal, vol. 59, No. 2, Feb. 1980, pp. 229-257, "Design of Bubble Device Elements Employing Ion-Implanted Propagation Patterns".

*Primary Examiner*—James W. Muffitt
*Attorney, Agent, or Firm*—Joseph E. Kieninger

[57] ABSTRACT

An improved non-data reversing one-way bubble transfer switch for contiguous disks is disclosed. The switch has a conductor arrangement in which one edge of the conductor is substantially concentric with and overlapping with the major loop which is in the form of a plurality of scallops. The major loop extends in a direction substantially transversely to one of the three primary crystallographic axes in the bubble material so as to have a propagation track with a high margin on one side and a low propagation margin on the other side. The tip of a minor loop end portion is aligned substantially concentric with the scalloped concave portion of the major loop. This switch has a maximum bias field margin and a maximum phase margin.

6 Claims, 3 Drawing Figures

NON-DATA REVERSING BUBBLE TRANSFER SWITCH FOR CONTIGUOUS DISKS

DESCRIPTION

Technical Field

This invention relates to contiguous disk bubble devices and more particularly to an improved non-data reversing bubble switch.

It is a primary object of this invention to provide an improved non-data reversing bubble one-way transfer switch for contiguous disks.

It is another object of this invention to provide a non-data reversing switch having high bias field margins.

It is another object of this invention to provide a non-data reversing switch having large phase margins.

It is yet still another object of this invention to provide a non-data reversing switch that is free of conductor crossings in the transfer gap area.

BACKGROUND ART

Whereas a bidirectional bubble transfer switch is required in contiguous disk devices having a single major loop for both read and write transfer functions, a one-way switch is preferred when separate read and write major loops are employed. Better performance is expected from switch designs specialized for transfer in one direction.

A problem with separate read/write major loops using one-way transfer switches is data reversal. Data reversal results because ion-implanted tracks only propagate bubbles on the implanted side of the boundary and because the implanted side of the read major loop and the write major loop face each other. A number of approaches have been proposed to rearrange the data. One such data rearrangement switch was described by Keefe et al in the IBM Technical Disclosure Bulletin Vol. 23 No. 6 November 1980, pp 2595–2597. While this proposal did solve the data reversal problem, it had the disadvantage of requiring an idler loop which occupied extra area on the bubble chip.

Another approach to the data reversal problem was described by Nelson et al in a Bell System Technical Journal Vol. 59 No. 2 February 1980 article on pages 229–257 and is shown in FIG. 1. A one-way transfer switch 10 is described in which a wavy or snake-like major loop 12 has a hairpin conductor 14 positioned thereon so that a bubble was stretched through the major loop, i.e. from the cusp on side 16 to the tip on side 18, and then from the major loop track to the end 20 of the minor loop 22. In this design the original side 16 of the major loop track 12 is designed to be attractive and the opposite side 18 to be repulsive after the bubble is stripped through the boundary. This is as a result of the relative position of the major loop side 18 and minor loop end 20. Then the bubble moves again to the attractive position at the end of the minor loop with the help of the hairpin conductor. The phase margins with this switch are poor since they are limited by the hairpin conductor which crosses through the major loop propagation path. In addition, this switch is not reliable.

BRIEF DESCRIPTION OF THE DRAWING

In the accompanying drawings, forming a material part of this disclosure.

DISCLOSURE OF THE INVENTION

For further understanding of the invention and of the objects and advantages thereof, reference will be had to the following description and accompanying drawings, and to the appended claims in which the various novel features of the invention are more particularly set forth.

An improved non-data reversing one-way bubble transfer switch for contiguous disks is disclosed. The switch has a conductor arrangement in which one edge of the conductor is substantially concentric with and overlapping with the major loop which is in the form of a plurality of scallops. The major loop extends in a direction substantially transversely to one of the three primary crystallographic axes in the bubble material so as to have a propagation track with a high margin on one side and a low propagation margin on the other side. The tip of the minor loop end portion is aligned substantially concentric with the scalloped concave portion of the major loop. A bubble propagates along the high margin side of the major loop. When a current is passed through the conductor, the bubble moves across the major loop to the other side of the scallop and from there to the tip of the minor loop. This switch has a maximum bias field margin and a maximum phase margin.

BEST MODE OF CARRYING OUT THE INVENTION

Figure 2:
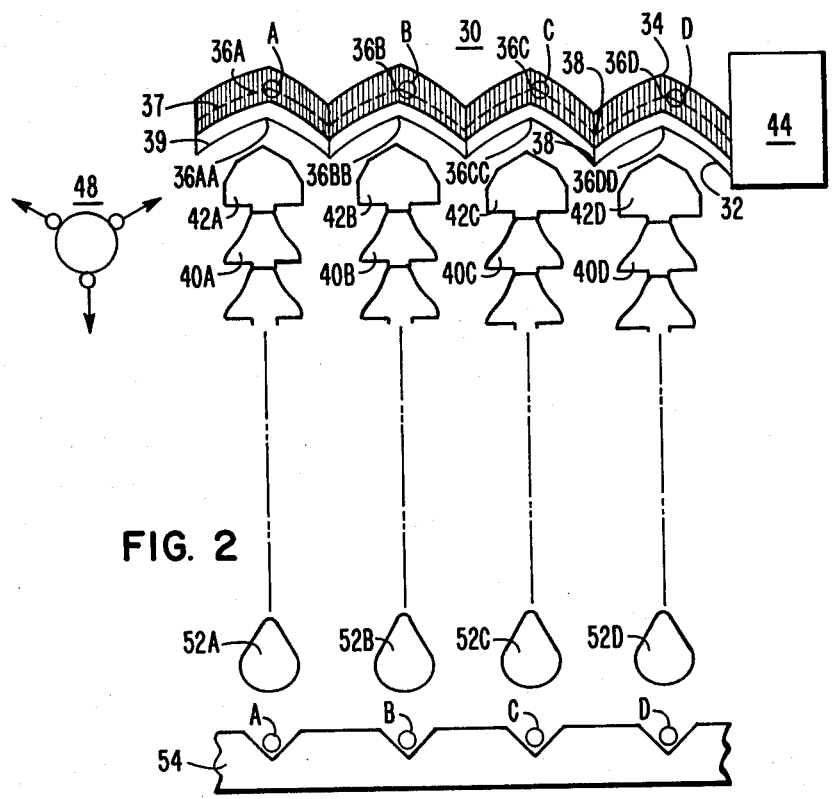
FIG. 2 is a schematic view of the switch in accordance with this invention.

Referring to FIG. 2, the bubble transfer switch 30 includes a major loop 32 that has a scalloped shape with a tip portion 36 and a cusp portion 38 on side 37. Positioned on top of the major loop 32 is the conductor 34. The shape of the conductor 34 is similar to that of the major loop. The conductor 34 overlaps the major loop 32. In a preferred embodiment the conductor 34 overlaps about two-thirds of the width of major loop 32. This preferred conductor overlap allows the bubble to be positioned at or near the center of the conductor prior to the transfer so that the bubble does not experience a collapsing field from the conductor. In another embodiment the width of the conductor is sufficient so that it overlaps the major loop completely so that the bubble is still positioned at or near the center of the conductor.

Minor loops 40A, B, C and D have tip portions 42A, B, C and D respectively which are positioned in spaced relationship with the major loop scalloped concave portions 36AA, 36BB, 36CC and 36DD respectively. The minor loop tip portions 42A–D are aligned substantially concentric with the scalloped concave portions 36AA, BB, CC and DD respectively on side 39 of major loop 32.

Figure 1:
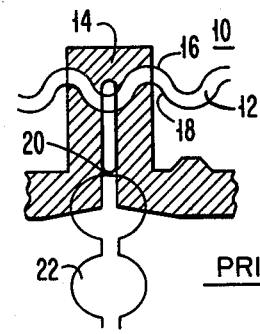
FIG. 1 is a schematic view of a prior art structure.

Bubbles from generator 44 propagate along side 37 of major loop 32. The side 37 has a high propagation margin due to the orientation shown in 48. A propagation alongside 39 on the other side of the major loop 32 has a lower propagation margin. Passing a current through the conductor 34 supplies the gradient field necessary to transfer the bubble across the non-implanted region of the major loop, that is, from side 37 to side 39, and assists the stripping out of the bubble between the side 39 of the major loop to the tip of the minor loop 42A through D. A charged wall which bridges the gap between the major loop and minor loop is formed because the minor loop tip portions 42A–D are aligned substantially concentric with the major loop scalloped concave portions. This bridging charged wall also assists the conductor in the stripping out of the bubble. Because the side 39 is a poor propagator, a bubble once stripped across the gap between major loop and minor loop tip will always transfer to the tip of the minor loop. The conductor 34 arrangement is such that no matter where the bubble resides on side 37 of major loop 32, the bubble always experiences a reinforcing field from the conductor, never a collapsing field such as experienced by bubbles in the prior art switch shown in FIG. 1.

Bubbles A, B, C, D positioned on the scalloped tip portions 36A, B, C, D respectively of side 37 of the major loop will move through the major loop 32 to the scalloped concave portion 36AA, 36BB, 36CC and 36DD respectively. The bubble then passes to the tip 42A, 42B, 42C and 42D respectively of minor loops 40A–40D. The bubbles propagate down the minor loops to the end portions 52A and 52B from which the bubbles are propagated to read channel 54. The bubbles A, B etc. are in the same alignment as propagated. Hence, it is a non-data reversing one-way bubble transfer switch.

Figure 3:
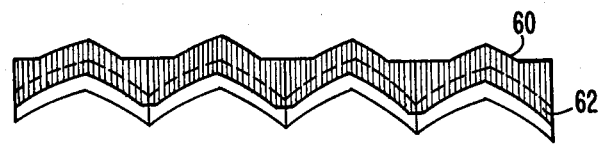
FIG. 3 is a schematic view showing a second switch embodiment in accordance with this invention.

Another arrangement of the conductor 60 is shown in FIG. 3. The scalloped major loop 62 has the same shape as in FIG. 2. The conductor 60 is substantially parallel to the major loop 62 with the exception that the cusp portions do not correspond exactly.

While I have illustrated and described the preferred embodiments of my invention, it is understood that I do not limit myself to the precise constructions herein disclosed and the right is reversed to all changes and modifications coming within the scope of the invention and defined in the appended claims.

We claim:
1. A combination suitable for one-way switching in a contiguous disk bubble device comprising
   a major loop having a plurality of scallops therein, said scallops having a concave portion,
   a conductive having edge portions substantially concentric with the edge of said major loop, and
   at least one minor loop extending in a direction substantially transversely to the direction of said major loop, said minor loop having a tip portion positioned substantially in line with the center of said scalloped concave portion, said minor loop positioned in spaced relation with said conductor.
2. A combination as described in claim 1 wherein said conductor overlaps said major loop.
3. A combination as described in claim 1 wherein said conductor overlaps a sufficient width of said major loop so that a bubble is positioned at or near the center of the conductor prior to the transfer so that the bubble does not experience a collapsing field from the conductor.
4. A combination as described in claim 1 wherein said major loop extends in a direction substantially transversely to one of the three primary crystallographic axes in the bubble material to provide a first side with a propagation track with a high propagation margin and a second side with a propagation track with a lower propagation margin.
5. A combination as described in claim 1 wherein said minor loop tip portion is substantially concentric with said major loop scalloped tip portion.
6. A combination as described in claim 1 wherein said minor loop tip portion is separated from said major loop scalloped tip portion by a gap having the width of about twice the diameter of a bubble used in said bubble device.

* * * * *